(12) United States Patent
Brooks et al.

(10) Patent No.: US 7,002,405 B2
(45) Date of Patent: Feb. 21, 2006

(54) LINEAR LOW NOISE TRANSCONDUCTANCE CELL

(75) Inventors: Todd Brooks, Laguna Beach, CA (US); Jungwoo Song, Irvine, CA (US); Wynstan Tong, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/777,629

(22) Filed: Feb. 13, 2004

(65) Prior Publication Data

US 2004/0160245 A1    Aug. 19, 2004

Related U.S. Application Data

(60) Provisional application No. 60/447,332, filed on Feb. 14, 2003.

(51) Int. Cl.
  *G05G 7/12*    (2006.01)
  *G05G 7/26*    (2006.01)
(52) U.S. Cl. ..................................... 327/563; 330/253
(58) Field of Classification Search ................ 327/103, 327/560–563; 330/252–253
See application file for complete search history.

(56) References Cited

U.S. PATENT DOCUMENTS

| 3,356,858 | A | * | 12/1967 | Wanlass | 326/103 |
|---|---|---|---|---|---|
| 4,080,828 | A | * | 3/1978 | Akita et al. | 73/308 |
| 5,043,652 | A | * | 8/1991 | Rybicki et al. | 323/316 |
| 5,179,298 | A | * | 1/1993 | Hirano et al. | 326/83 |
| 5,682,123 | A | * | 10/1997 | Chau | 331/57 |
| 6,552,611 | B1 | * | 4/2003 | Yamamoto | 330/253 |
| 6,570,447 | B1 | * | 5/2003 | Cyrusian et al. | 330/254 |
| 6,744,319 | B1 | * | 6/2004 | Kim | 330/254 |
| 6,791,415 | B1 | * | 9/2004 | Mitteregger | 330/260 |

* cited by examiner

*Primary Examiner*—Quan Tra
(74) *Attorney, Agent, or Firm*—Sterne Kessler Goldstein Fox PLLC

(57) ABSTRACT

A low noise transconductance cell includes a resistor and a differential circuit pair having two equivalent half-circuits. Each half-circuit includes a feedback loop coupled to the resistor. The feedback loop includes an input transistor coupled to an inverting gain stage. The inverting gain stage is coupled to an output transistor which in turn is coupled to the input transistor and the resistor. In a low noise transconductance cell, a bias current source is coupled to the center of series connected resistors. In a high swing transconductance cell, a first bias current source is coupled to the left terminal of a resistance stage and a second bias current source is coupled to the right terminal of the resistance stage. The resistance stage can include a single resistor or a plurality of resistors.

50 Claims, 9 Drawing Sheets

LINEAR LOW NOISE TRANSCONDUCTANCE CELL

CROSS REFERENCE TO RELATED APPLICATIONS

This application claims priority to U.S. Provisional Application No. 60/447,332, entitled "Microphone Preamplifier Circuit with Low Noise GM Transconductance Cell," filed Feb. 14, 2003, which is incorporated herein by reference in its entirety.

FIELD OF THE INVENTION

The application relates generally to amplifiers and more particularly to transconductance cells.

BACKGROUND OF THE INVENTION

Analog signal processing is commonplace in a wide variety of low-power, low-cost applications such as mobile telephones, laptops, personal digital assistants (PDAs), hearing aids, etc. These applications usually require low noise, low power, and high performance circuits. In addition, these applications require low total harmonic distortion (THD) which is related to the linearity of the circuit. To achieve the desired operating characteristics, many of these signal processing applications use programmable gain amplifiers (PGAs) and analog filters where signals of varying strengths must be either amplified or attenuated before signal processing.

A key component of several analog signal processing circuits is a linear transconductance cell. For example, linear transconductance cells are used in analog filters and PGAs. A common implementation of a linear transconductance cells uses a resistively degenerated differential transistor pair with one or more resistors placed in series between the source nodes of the two transistors. The differential transistor pair is operably coupled to receive a differential input voltage and, based on the transconductance, produce a differential output current. However, in these differential transistor pairs, the transistors effect the transconductance. As a result, the linearity of the analog signal processing circuit is limited. Furthermore, the value of the transconductance depends on the transistor characteristics, which vary as a function of the manufacture process and the temperature of the device. Consequently, the gain of the transconductance cell is not accurate.

Resistive degeneration is typically used in the differential transistor pair to reduce the effect of the transistors on the transconductance value. For example, if the conductance of one or more resistors placed in series between the source terminals of the differential pair transistors is much smaller than the transconductance of the transistors, the overall transconductance is substantially determined by the conductance of the resistors. Consequently, the transistors have less effect on the transconductance and the linearity of the circuit is improved. Furthermore, the transconductance value depends primarily on resistor conductance, which typically depends less upon the manufacture process and temperature. However, these improvements in linearity and transconductance are expensive. A differential transistor pair implementation without resistive degeneration typically requires less power and area to obtain a specified transconductance value with a specified level of current noise.

Therefore, a need exists for a transconductance cell that has low noise, good linearity, good gain accuracy, low power consumption, and small area.

BRIEF SUMMARY OF THE INVENTION

The present invention is directed to a low noise transconductance cell. The present invention is also directed to a programmable gain amplifier having a low gain transconductance cell and a high gain transconductance cell.

In accordance with aspects of the present invention, a transconductance cell includes resistance stage coupled between two equivalent half circuits. Each half-circuit includes a feedback loop. In the feedback loop the drain of the input differential transistor is coupled to the input of the inverting gain stage. The output of the inverting gain stage is coupled to the gate of the output differential transistor. The source of the output differential transistor is coupled to the source of the input transistor. The resistance stage is coupled to the source of the input transistor in each feedback loop. In an aspect of the present invention, the resistance stage includes a resistor. In another aspect of the present invention, the resistance stage includes a plurality of resistors.

In accordance with aspects of the present invention, a low noise transconductance cell includes a bias current source coupled between a first circuit node (e.g., $V_{DD}$) and a differential circuit pair having two equivalent half circuits. The low noise transconductance cell also includes an optional load current stage having two or more current sources. Each half-circuit includes a feedback loop coupled to a resistor. The resistor in the first half-circuit is coupled in series to the resistor in the second half circuit. The current source is connected to a first circuit node and a node between the two resistors. In the feedback loop the drain of the input differential transistor is coupled to the input of the inverting gain stage. The output of the inverting gain stage is coupled to the gate of the output differential transistor. The source of the output differential transistor is coupled to the source of the input transistor. In each feedback loop, the drain of the input transistor is coupled to a current source in the load current stage. In accordance with another aspect of the present invention, the drain of the output transistor is coupled to a current source in the load current stage.

In accordance with aspects of the present invention, high swing transconductance cell includes differential circuit pair having two equivalent half circuits. High swing transconductance cell also includes a load current stage having two or more current sources. Each half-circuit includes a feedback loop coupled to a resistor. The resistor in the first half-circuit is coupled in series to the resistor in the second half circuit. The high swing cell further includes two bias current sources. The first bias current source is connected to the left terminal of the series connected resistors and the second bias current source is connected to the right terminal of the series connected resistors. In accordance with another aspect of the present invention, a single resistor is used in place of two series connected resistors. In the feedback loop the drain of the input differential transistor is coupled to the input of the inverting gain stage. The output of the inverting gain stage is coupled to the gate of the output differential transistor. The source of the output differential transistor is coupled to the source of the input transistor. In each feedback loop, the drain of the input transistor is coupled to a current source in the load current stage. In accordance with another aspect of the present invention, the drain of the output transistor is coupled to a current source in the load current stage.

In accordance with aspects of the present invention, the low noise transconductance cell has improved linearity and optionally programmable resistance. Low noise transconductance cell includes two equivalent feedback loops. In each feedback loop, the drain of the input transistor is coupled to the negative input of the amplifier. A floating voltage source is coupled between the source of the input transistor and the positive terminal of the amplifier. The output of the amplifier is coupled to the gate of the output transistor. In accordance with another aspect of the present invention, the low noise transconductance cell includes a plurality of resistance stages that can be coupled between the feedback loops, as needed.

In accordance with aspects of the present invention, transconductance cell includes two equivalent feedback loops, a first resistance stage, and a second resistance stage. When the first resistance stage is needed, switches couple the first resistance stage between the first and second feedback loops. When the second resistance stage is needed, switches couple the second resistance stage between the first and second feedback loops. In accordance with another aspect of the present invention, when the first resistance stage is needed, first and second current sources are coupled, via switches, to a circuit node (e.g., supply voltage) and to a node between the first and second resistors of the first resistance stage. This makes the transconductance cell operate as a low noise transconductance cell. When the second resistance stage is needed, the first current source is coupled to first end of the second resistance stage and the second current source is coupled, via switches, to the second end of the second resistance stage. This makes the transconductance cell operate as a high swing transconductance cell.

In accordance with aspects of the present invention, an analog circuit includes a low noise transconductance cell, a high swing transconductance cell, and an output switch. In an aspect of the invention, the analog circuit may also include an input switch. When a low noise transconductance cell is required, the input switch couples the differential inputs of the switch to the differential inputs of the low noise transconductance cell. The output switch couples the differential outputs of the low noise transconductance cell to the inputs of the next circuit component. When a high swing transconductance cell is required, the input switch couples the differential inputs of the switch to the differential inputs of the high swing transconductance cell. The output switch couples the differential outputs of the low gain transconductance cell to the inputs of the next circuit component.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
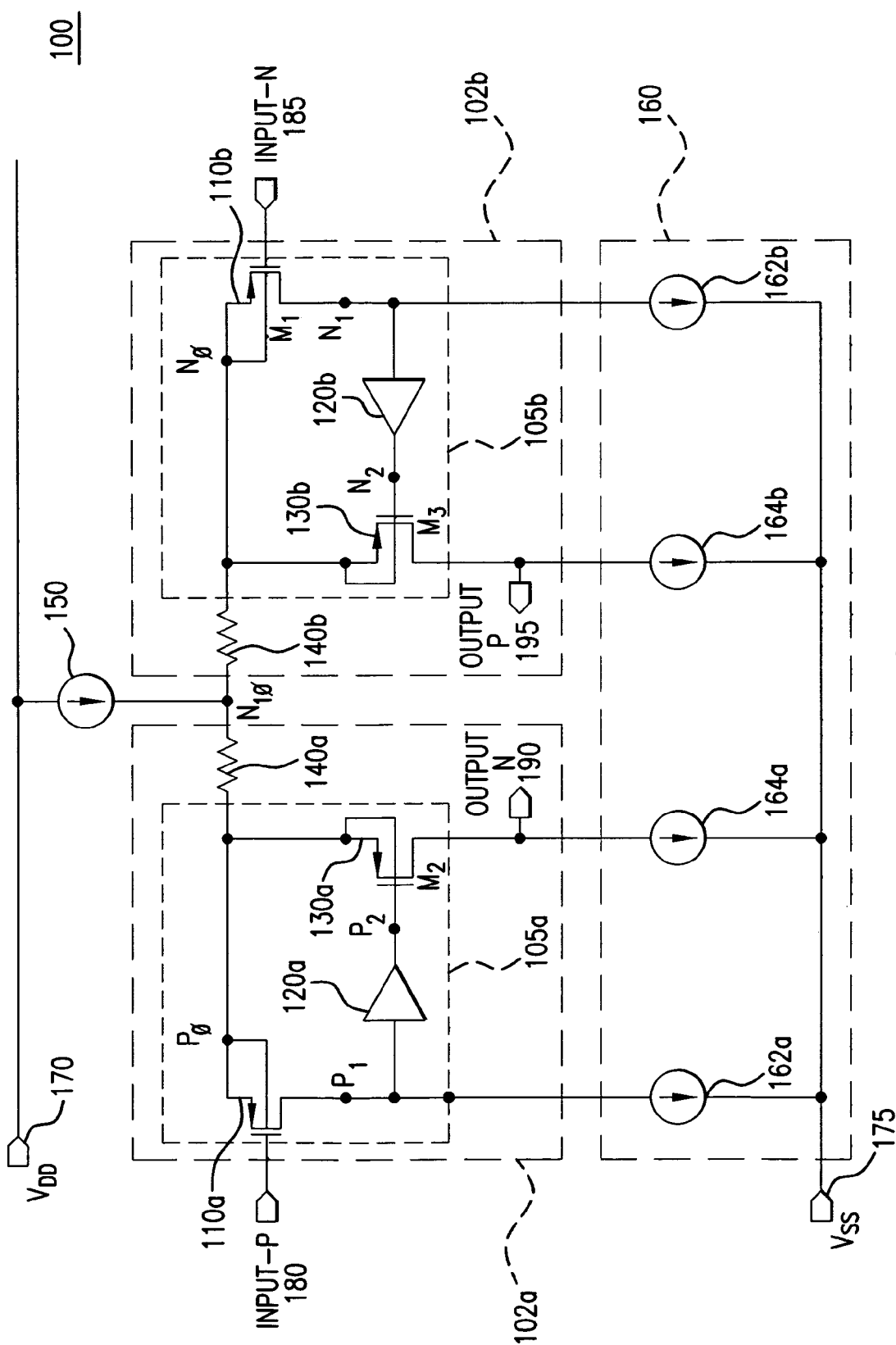
FIG. 1 is a block diagram of a low noise transconductance cell, according to an embodiment of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

FIG. 1 is a block diagram of a low noise transconductance cell 100, according to an embodiment of the present invention. Transconductance cell 100 is connected between supply potential $V_{DD}$ 170 and supply potential $V_{SS}$ 175. In operation, transconductance cell 100 is operably coupled to receive a differential input voltage at input-p 180 and input-n 185. Transconductance cell 100 then converts the differential input voltage into a differential output current at output-n 190 and output-p 195.

Transconductance cell 100 includes a differential circuit pair having two equivalent half-circuits 102a and 102b, a bias current source 150, and a load current stage 160. The dimensions and values of the components in each half-circuit are matched to create the balanced differential circuit.

Each half-circuit 102a, 102b includes a feedback loop 105a, 105b. In an embodiment of the present invention, each half-circuit 102a, 102b also includes a resistor 140a, 140b coupled to the feedback loop 105a, 105b and the bias current source 150. The resistors 140a, 140b may be small valued resistors. Because the transconductance for the cell 100 is determined by the two resistors 140a, 140b, the use of smaller-valued resistors gives the cell a larger transconductance. If resistors 140a and 140b are small valued resistors, the transconductance is large, thereby causing transconductance cell 100 to be a high gain transconductance cell. In an embodiment of the invention, a single resistor is coupled to the feedback loop of the first half-circuit 102a and the feedback loop of the second half-circuit 102b.

Each feedback loop 105a, 105b includes a first input transistor 110a, 110b, an inverting gain stage 120a, 120b, and a first output transistor 130a, 130b. The feedback loop operates to keep $V_{GS}$ of the input transistor 110a, 110b constant (i.e., independent of input voltage variations). That is, the feedback loop causes the source voltage of the input transistor 110a, 110b to track the gate voltage (i.e., input voltage) by a constant offset. Keeping $V_{GS}$ constant is desirable because if $V_{GS}$ varies, errors are introduced, affecting the operation of the cell 100. For example, if $V_{GS}$ varies non-linearly as a function of the differential input voltage, a non-linear voltage error is generated across resistors 140a and 140b. If $V_{GS}$ varies linearly as a function of the differential input voltage, a gain error in the output current is generated.

As shown in FIG. 1, to create the feedback loop in each half-circuit 102a, 102b, the drain of input transistor 110a, 10b is coupled to the input of inverting gain stage 120a, 120b. The output of inverter stage 120a, 120b is coupled to the gate of output transistor 130a, 130b. The source of the output transistor 130a, 130b is coupled to the source of the input transistor 110a, 110b.

In the first half-circuit 102a, the gate of input transistor 110a is operably coupled to input-p 180 to receive one component (e.g., $V_{IN}+$) of the differential input voltage. The source of the input transistor 110a is coupled to a terminal of resistor 140a. The drain of the input transistor 110a is coupled to a first current source 162a in the load current stage 160. In an embodiment of the invention, the drain of the output transistor 130a is optionally coupled to a second current source 164a in the load current stage 160.

In the second half-circuit 102b, the gate of input transistor 110b is operably coupled to input-n 185 to receive one component (e.g., $V_{IN}-$) of the differential input voltage. The source of the input transistor 10b is coupled to a terminal of resistor 140b. The drain of the input transistor 10b is coupled to a third current source 162b in the load current stage 160. In an embodiment of the invention, the drain of the output transistor 130b is optionally coupled to a fourth current source 164b in the load current stage 160.

Load current stage 160 includes a plurality of current sources 162a and 162b. In an embodiment, load current stage 160 may also include one or more current sources 164a and 164b. Current sources 162a and 162b operate to sink a constant amount of current out of node P1 and node N1, respectively.

In an embodiment of the present invention, a first impedance is coupled to the drain of input transistor 110a, in place of current source 162a, and a second impedance is coupled to the drain of input transistor 110b, in place of current source 162b. The first and second impedances may include, for example, a resistor.

Feedback loops 105a, 105b operate to keep the net current at nodes P1 and N1 equal to zero. For example, considering the first half-circuit 102a in isolation, if the voltage at input-p rises quickly, then the $V_{GS}$ of input transistor 110a initially decreases. This results in a decrease in the current sourced out of the drain of input transistor 110a into node P1. Thus, more current is being sunk out of node P1 than is being sourced into the node. This, in turn, causes the voltage at node P1 to decrease. The inverting gain stage 120a amplifies the voltage at node P1 and inverts it onto the gate of output transistor 130a. This causes the $V_{GS}$ of output transistor 130a to decrease which in turn reduces the amount of current that output transistor 130a is sinking out of node P0. Thus, the voltage at node P0 rises (i.e., the source voltage of input transistor 110a) which increases the $V_{GS}$ of input transistor 110a. This process continues until the current sourced from the drain of input transistor 110a is equal to the current being sunk into current source 162a.

Current sources 162a and 162b provide constant currents. The negative feedback provided with feedback loops 105a, 105b operates to adjust the currents in input transistors 110a and 110b until they are constant. If the differential input voltages move slowly, then the negative feedback response can operate quickly enough such that the currents in input transistors 110a and 110b do not vary substantially with the changing differential input voltage. For example, if the frequency content of the differential input voltage is low with respect to the bandwidth of feedback loops 105a, 105b, the negative feedback response is fast. In this case, the response is quick enough to maintain a small variation of current and a small variations of $V_{GS}$ in input transistors 110a, 110b as a function of the changing differential input voltage.

Current sources 164a and 164b are optional. When present, they operate to remove any DC bias current present at the output. If current sources 164a and 164b are not present, DC bias current will be present at the output. In an embodiment, the drains of output transistors 130a and 130b may be coupled to other circuits instead of current sources 164a, 164b.

In an embodiment of the present invention, the wells of input transistor 110a and input transistor 110b are coupled to their respective sources. Coupling the well of a transistor to the source is advantageous because no potential voltage difference can be developed between the well (bulk terminal) and the source terminal of the transistor. The source terminals, P0 and N0, of input transistors 110a and 110b track the input voltages at input-p 180 and input-n 185. If the well or bulk terminals are not coupled to source terminals P0 and N0, then the voltage between the bulk and source terminals may vary with the differential input voltage. In this case, the varying bulk-source voltage causes a varying nonlinear signal-dependent current to flow in input transistors 110a and 110b. This causes the $V_{GS}$ of input transistors 110a and 110b to vary resulting in degradation of the gain accuracy and linearity of transconductance cell 100. In an alternate embodiment of the present invention, the well of transistor 110a is driven to equal a voltage which tracks the voltage at input-p 180 and the well of transistor 110b is driven to equal a voltage which tracks the voltage at input-n 185. In an embodiment of the present invention, the wells of output transistor 130a and output transistor 130b may also be coupled to their respective sources.

In an embodiment, bias current source 150 is coupled between a first circuit node (e.g., supply potential $V_{DD}$ 170) and node $N_{10}$. Although FIG. 1 depicts bias current source 150 as coupled to supply potential $V_{DD}$ 170, as would be appreciated by persons of ordinary skill in the relevant art(s), bias current source 150 could be coupled to another circuit node. Node $N_{10}$ is between the first half-circuit 102a and the second half-circuit 102b of the differential circuit pair. Bias current source 150 operates to bias the differential circuit pair 102. By placing the bias current source 150 in between the two equivalent half-circuits 102a, 102b, the differential noise due to the current source is significantly reduced or eliminated. However, this method of biasing decreases the headroom of the circuit. Current from bias current source 150 flows through resistors 140a and 140b causing a voltage drop across these resistors. A smaller percentage of the supply voltage is then available for half circuits 102a and 102b, load current stage 160, and bias current source 150. Because the voltage available for these circuits is reduced, it is more difficult to obtain good linearity over a wide range of differential input voltage swing. This method of biasing is preferred in applications where the differential input voltage swing is small and noise performance is more critical than linearity performance. As would be appreciated by a person skilled in the art, other methods for biasing the differential circuit pair could be used with the present invention.

In applications where the differential input voltage swing is small, it is typically desirable to provide a high gain to amplify the small differential input voltage. In an embodiment of the present invention, resistors 140a and 140b are implemented as small valued resistors such that transconductance cell 100 is a high gain transconductance cell. In this embodiment, transconductance cell 100 amplifies small differential input voltages with high gain to generate output currents large enough to meet the requirements of an analog circuit, such as a PGA or analog filter, which incorporates the transconductance cell 100.

Transistors 10a, 110b, 130a, and 130b are PMOS transistors in the circuit shown in FIG. 1. If the polarity of all transistors is reversed (i.e., all the NMOS transistors in FIG. 1 were replaced with PMOS transistors, all the PMOS transistors were replaced with NMOS transistors, current sources 162a, 162b, 164a, and 164b are reversed such that they source current into nodes P1, N1, output-n 190 and output-p 195, and current source 150 is reversed such that it sinks current out of node N10), the circuit would work in the same manner. It is important, however, that transistors 110a and 110b are the same polarity (i.e., NMOS or PMOS) and transistors 130a and 130b are of the same polarity.

In an embodiment of the present invention, transconductance cell 100 may also include a second bias current source (not shown) coupled to a first circuit node (e.g., supply potential $V_{DD}$) and the first terminal of resistor 140a and a third bias current source (not shown) coupled to a second circuit node (e.g., supply potential $V_{DD}$) and the second terminal of resistor 140b.

Figure 1A:
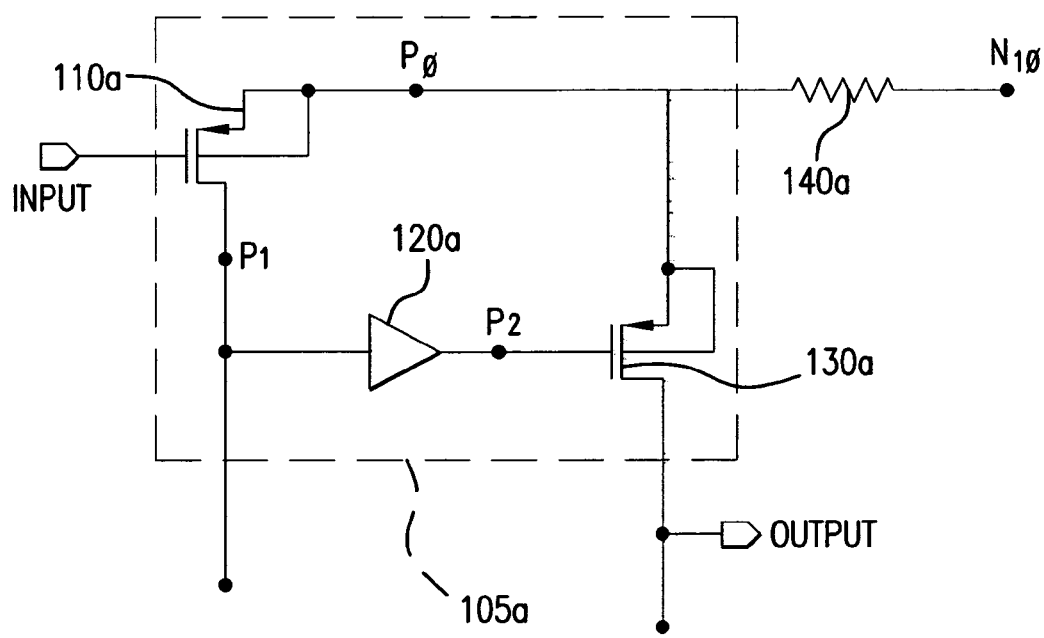
FIG. 1A is a block diagram of a single-ended transconductance cell, according to an embodiment of the present invention.

Transconductance cell 100 has been described above as being differential. Persons of ordinary skill in the relevant art will recognize that the transconductance cell of the present invention may also be single ended, as shown in FIG. 1A. FIG. 1A depicts a block diagram of a single-ended transconductance cell 100A in according to embodiments of the present invention. Transconductance cell 100A includes a feedback loop 105a coupled to a resistor 140a. Feedback loop 105a was described above in reference to FIG. 1. In an embodiment of the present invention, Node $N_{10}$ can be coupled to a low impedance node having relatively constant voltage. The drain of input transistor 110a and the drain of output transistor 130a are coupled to circuits as described above in reference to FIG. 1.

Figure 2:
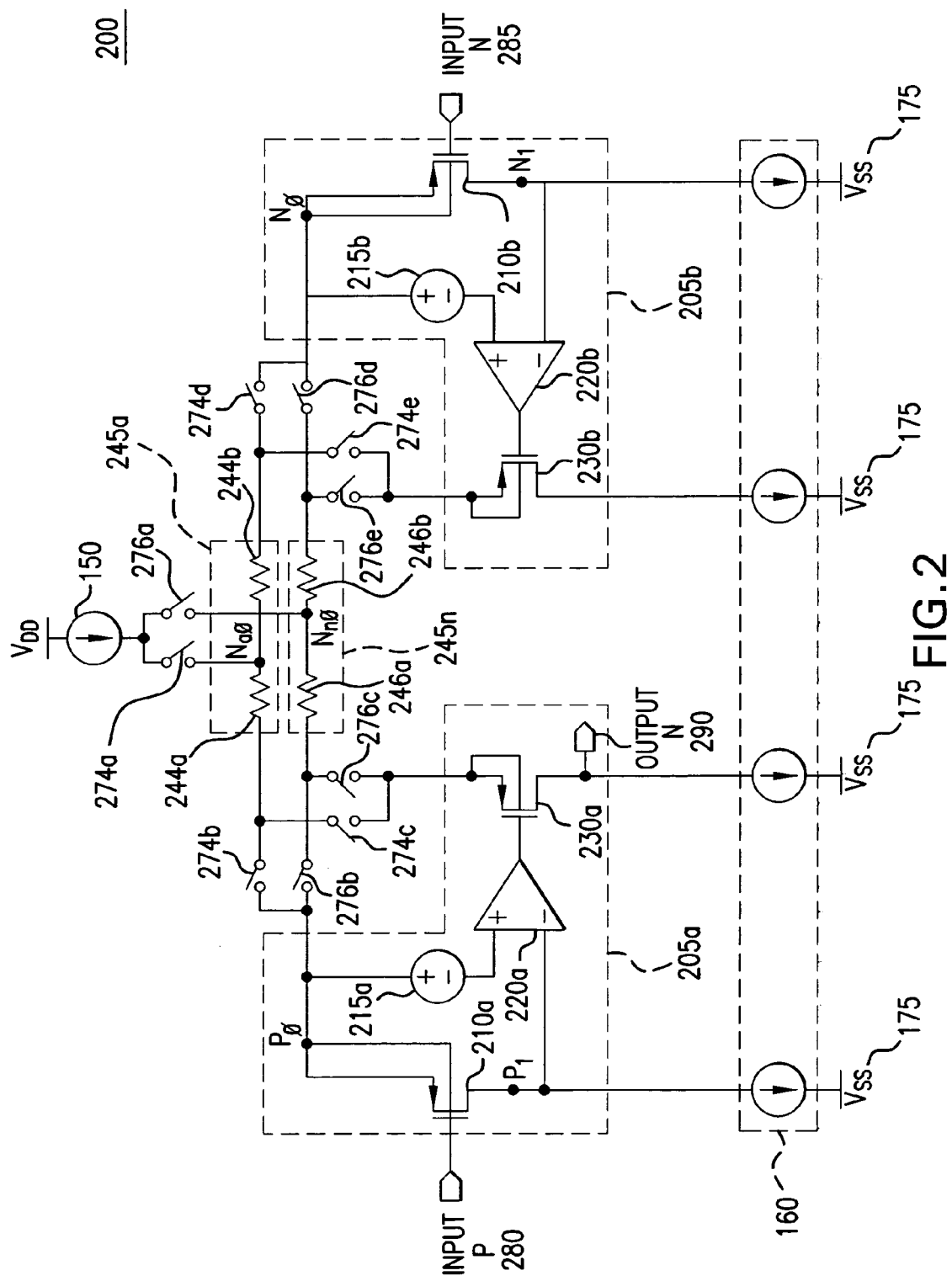
FIG. 2 is a block diagram of a low noise transconductance cell 200 with improved linearity and programmable transconductance, according to embodiments of the present invention

FIG. 2 is a block diagram of a low noise transconductance cell 200 with improved linearity and programmable transconductance, according to embodiments of the present invention. Transconductance cell 200 includes two equivalent feedback loops 205a, 205b, a bias current source 150, and a load current stage 160. Load current stage 160 and bias current source 150 were described above in reference to FIG. 1.

In an embodiment of the present invention, a resistance stage is coupled between feedback loops 205a, 205b. The resistance stage may consist of a single resistor or a plurality of resistors as described above. In addition, bias current source 150 may be replaced with two bias current sources coupled to the left terminal of the resistance stage and the right terminal of the resistance stage, as described below in reference to FIG. 4.

Each feedback loop 205a, 205b includes a first input transistor 210a, 210b, an amplifier 220a, 220b having a positive terminal and a negative terminal, a floating voltage source 215a, 215b, and a first output transistor 230a, 230b. As described in connection with the low noise transconductance cell 100 of FIG. 1, feedback loop 205a, 205b operates to keep $V_{GS}$ of the input transistor 210a, 210b constant.

In each feedback loop, the drain of input transistor 210a, 210b is coupled to the negative input of amplifier 220a, 220b. Floating voltage source 215a, 215b is coupled between the source of input transistor 210a, 210b and the positive terminal of amplifier 220a, 220b. The output of amplifier 220a, 220b is coupled to the gate of output transistor 230a, 230b.

Floating voltage source 215a, 215b is designed such that the voltage at the positive terminal of amplifier 220a, 220b is lower than the voltage at node $P_0$, $N_0$ In an embodiment of the present invention, floating voltage source 215a, 215b is implemented using the combination of a current source and a resistor. The resistor is coupled between the source of input transistor 210a, 210b and the positive terminal of amplifier 220a, 220b. The current source is connected to the positive terminal of amplifier 220a, 220b. The current source sinks current through the resistor to cause a voltage drop across the resistor and to cause a lower voltage at the positive terminal of amplifier 220a, 220b. As would be appreciated by persons of the ordinary skill of the art(s), other floating voltage sources can be used with the present invention.

The voltage at the input of the positive terminal of amplifier 220a, 220b acts as the threshold voltage for the amplifier. When the voltage at node $P_1$, $N_1$ (negative input terminal) decreases below the voltage at the positive terminal, the voltage at the output of amplifier 220a, 220b increases. When the voltage at node $P_1$, $N_1$ increases above the voltage at the positive terminal, the voltage at the output of amplifier 220a, 220b decreases.

In an embodiment of the present invention, the value of the resistance in the resistance stage between the source of input transistor 210a and the source of 210b can be programmed, as shown in FIG. 2. Transconductance cell 200 includes a plurality of resistance stages 245a through 245n that can be switched into transconductance cell 200, as needed. Each resistance stage includes at least two resistors connected in series.

Resistance stage 245a includes resistors 244a and 244b. Resistance stage 245n includes resistors 246a and 246b. When selected, a resistance stage 245a-n is coupled to feedback loops 205a and 205b and bias current source 150 by closing the associated switches. For example, when resistance stage 245a is selected, switches 274a, b, c, d, and e are closed, coupling the source of input transistor 210a and the source of output transistor 230a to resistor 244a, the source of input transistor 210b and the source of output transistor 230b to resistor 244b, and bias current source 150 to node $N_{a0}$. In an embodiment of the invention, a resistor may also be coupled to the source of input transistor 210a and the source of input transistor 210b, in parallel with the plurality of resistance stages.

Figure 3:
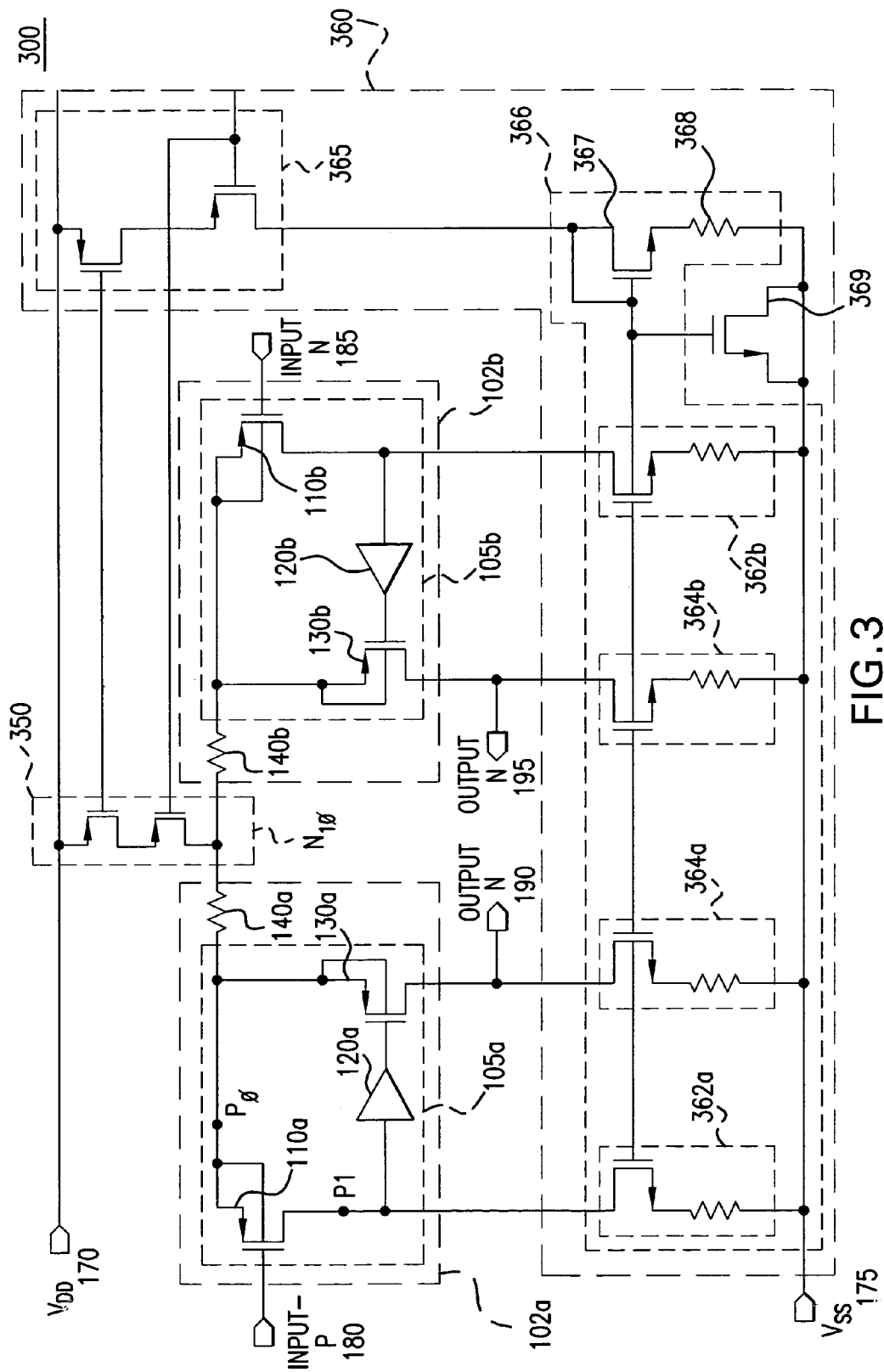
FIG. 3 is a block diagram of a low noise transconductance cell having a degenerated current mirror in the load current stage, according to embodiments of the present invention.

FIG. 3 is a block diagram of a low noise transconductance cell 300 having a degenerated current mirror in the load current stage, according to embodiments of the present invention. Transconductance cell 300 includes a differential circuit pair having two equivalent half-circuits 102a, 102b, a bias current source 350, and a load current stage 360. The differential circuit pair was described above in reference to FIG. 1.

As shown in FIG. 3, the load current stage 360 is implemented using a degenerated current mirror. As would be appreciated by persons skilled in the art, other types and configurations of current mirrors can be implemented in transconductance cell 300. However, for low noise applications, the use of a degenerated current mirror provides an advantage in noise performance.

Load current stage 360 includes a current source 365 coupled between supply potential $V_{DD}$ 170 and degenerated current mirror 366. Degenerated current mirror 366 includes a diode connected transistor 367 coupled in series with a resistor 368, current sources 362a and 362b, and optionally current sources 364a and 364b. The gate and drain of diode connected transistor 367 are coupled to current source 365. A resistor 368 is coupled between the source of diode connected transistor 367 and supply potential $V_{SS}$ 175. Current source 365 includes two PMOS transistors coupled in series. As would be appreciated by persons skilled in the relevant art(s), current source 365 could be implemented using various techniques without departing from the spirit or scope of the present invention.

Each current source, 362a, 362b, 364a, and 364b, includes an NMOS transistor coupled in series with a resistor. The gate and drain of diode connected transistor 367 are coupled to the gates of the transistors in current sources 362a and 362b. When current sources 364a and 364b are present, the gate and drain of diode connected transistor 367 are also coupled to the gates of the transistor current sources 364a and 364b. Current sources 362a, 362b, 364a, and 364b each operate to sink a constant current out of the drain of the transistor to which they are connected. The amount of current sunk is a function of the dimensions of the transistors and the value of the resistors used in current mirror 366. In addition, the current sunk by each current source is proportional to the current sourced into current mirror 366.

In an embodiment of the present invention, load current stage 360 also includes a capacitor 369 which adds capacitance to current mirror 366. In an embodiment of the present invention, capacitor 369 is a transistor, as shown in FIG. 3. The gate of transistor 369 is coupled to the gate and drain of diode connected transistor 367 and the gates of the transistors in current sources 362a, 362b, 364a, and 364b. The drain and source of transistor 369 are connected to supply potential $V_{SS}$ 175. Note that although FIG. 3 depicts capacitor 369 coupled to supply potential $V_{SS}$ 175, capacitor 369 can be coupled to any low resistance node. The capacitance of transistor 369 together with the resistive impedance at the gates of the transistors in current mirror 366 form a first order pole which filters the noise of the gate bias voltage. The use of capacitor 369 helps to reduce the current noise of the circuit. As would be appreciated by persons having ordinary skill in the relevant art(s), other implementations of capacitor 369 can be used with the present invention.

Figure 4:
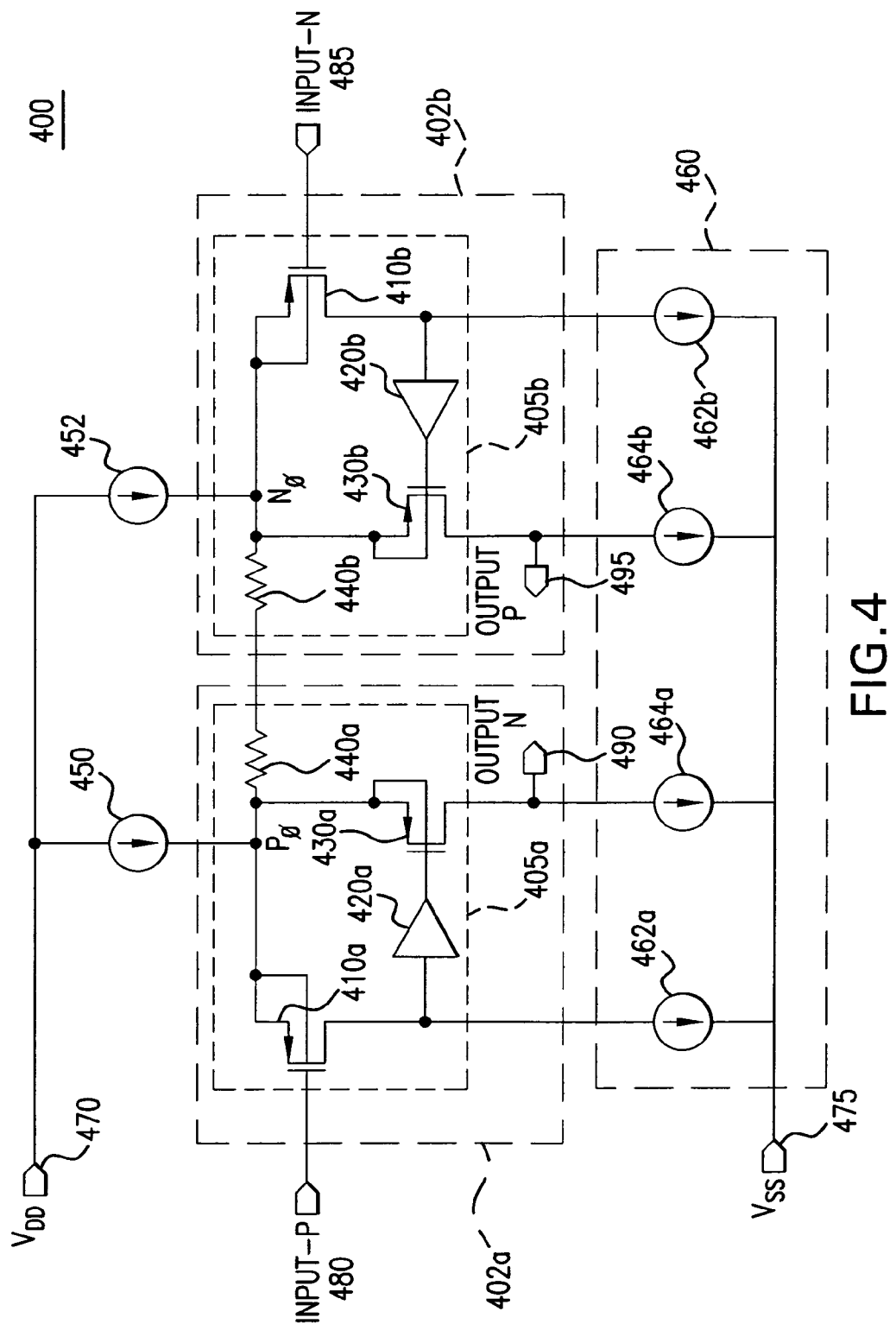
FIG. 4 is a block diagram of a high-swing transconductance cell, according to embodiments of the present invention.

FIG. 4 is a block diagram of a high-swing transconductance cell 400, according to an embodiment of the present invention. Transconductance cell 400 is connected between supply potential $V_{DD}$ 470 and supply potential $V_{SS}$ 475. In operation, transconductance cell 400 is operably coupled to receive a differential input voltage at input-p 480 and input-n 485. Transconductance cell 400 then converts the differential input voltage into a differential output current at output-n 490 and output-p 495.

Transconductance cell 400 includes a differential circuit pair having two equivalent half-circuits 402a, 402b, a first bias current source 450, a second bias current source 452, and a load current stage 460. The dimensions and values of the components in each half-circuit are matched to create the balanced differential circuit.

Each half-circuit 402a, 402b includes a feedback loop 405a, 405b. In an embodiment of the present invention, each half-circuit 402a, 402b also includes a resistor 440a, 440b. In first half-circuit 402a, the first terminal of resistor 440a is coupled to current source 450 and feedback loop 405a. The second terminal of resistor 440a is coupled to the second terminal of resistor 440b. In the second half-circuit 402b, the first terminal of resistor 440b is coupled to current source 452 and feedback loop 405. If resistors 440a, 440b are high valued resistors, the transconductance is small, thereby causing transconductance cell 400 to be a low gain transconductance cell. In an embodiment of the present invention, resistors 440a and 440b are implemented as a single resistor.

Feedback loops 405a, 405b and load current stage 460 are described above with reference to the feedback loops 105a, 105b and load current stage 160 of high gain transimpedance cell 100 in FIG. 1.

High-swing transconductance cell 400 must contend with larger input swings at differential inputs 480 and 485 than low-noise transconductance cell 100. As a result, high-swing transconductance cell 400 needs good linearity over a wider range of inputs than low-noise transconductance cell 100. In addition, if the differential input voltage swing is large, then noise performance of transconductance cell 400 is not as critical. To achieve good linear performance over a wide input range, high-swing cell 400 utilizes two bias current sources 450, 452 on the outside of the series connected resistors 440a and 440b.

In an embodiment, first bias current source 450 is coupled to a first circuit node (e.g., supply potential $V_{DD}$) and the first terminal of resistor 440a. Second bias current source 452 is coupled to a second circuit node (e.g., supply potential $V_{DD}$) and the second terminal of resistor 440b. Although FIG. 4 depicts bias current sources 450 and 452 as coupled to supply potential $V_{DD}$ 170, as would be appreciated by persons of ordinary skill in the relevant art(s), first and second bias current sources 450, 452 can be coupled to other circuit nodes. The headroom of the circuit 400 is increased because nodes $P_0$ and $N_0$ are connected to supply potential $V_{DD}$ through currents sources and not through resistors, as in transconductance cell 100. As a result, the bias current does not flow through resistors 440a and 440b and there is no average bias voltage drop across these two resistors. The supply voltage is dropped across bias current sources 450 and 452, half-circuits 402a and 402b, and load current stage 460. None of the available voltage is dropped across resistors 440a and 440b. Consequently, in comparison with low-noise transconductance cell 100, the high-swing transconductance cell 400 can tolerate greater swings in voltage on the inputs thus providing good linear performance over a wide range of input voltages. As would be appreciated by a person skilled in the art, other methods for biasing the differential circuit pair could be used with the present invention.

Figure 5:
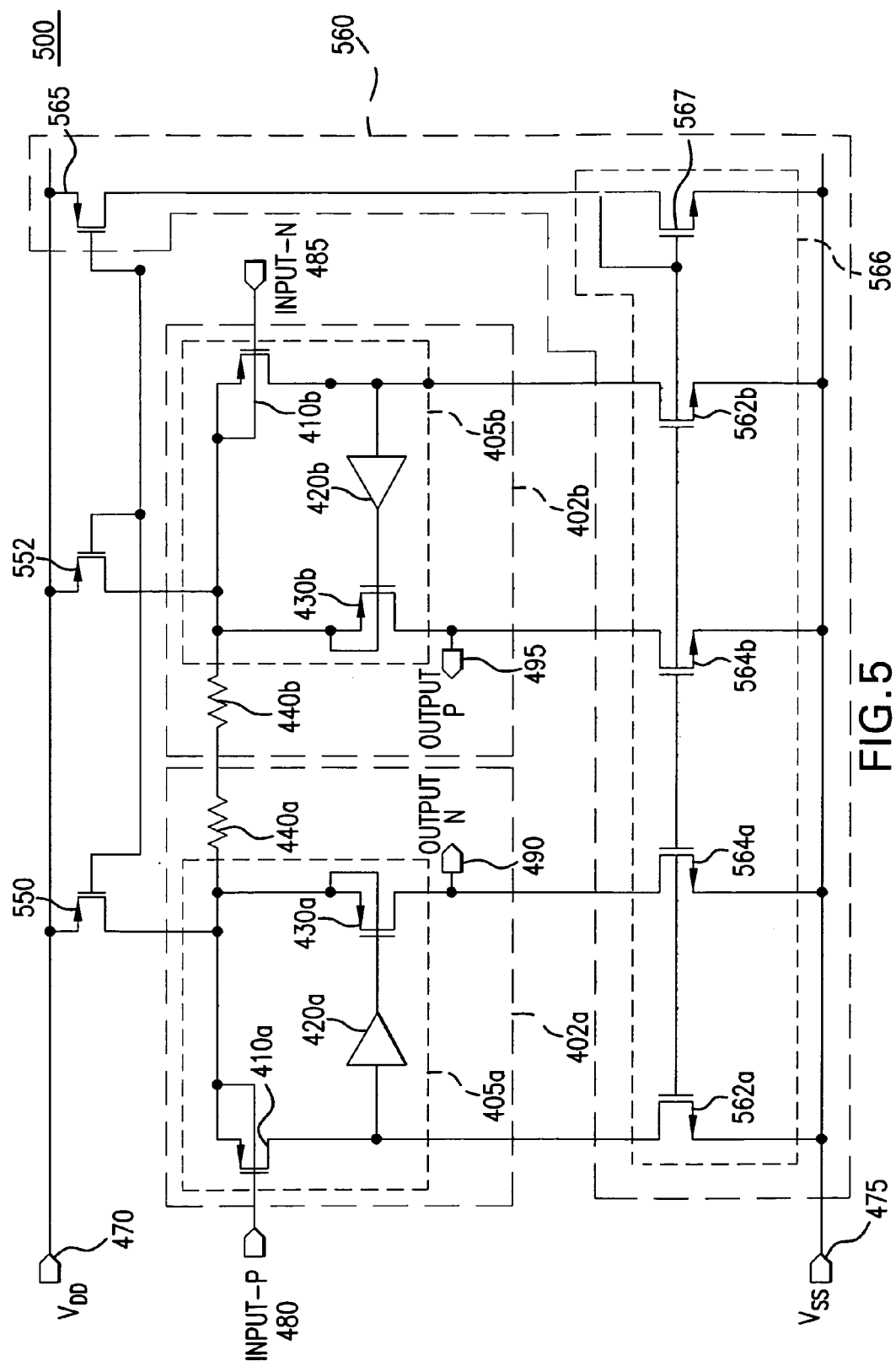
FIG. 5 is a block diagram of a high-swing transconductance cell having a current mirror in the load current stage, according to an embodiment of the present invention.

FIG. 5 is a block diagram of a high-swing transconductance cell having a current mirror in the load current stage, according to an embodiment of the present invention. Transconductance cell 500 includes a differential circuit pair having two equivalent half circuits 402a, 402b, first bias current source 550, a second bias current source 552, and a load current stage 560. The differential circuit pair and the two bias current sources 550 and 552 are described above in reference to FIG. 4.

As shown in FIG. 5, the load current stage 560 is implemented using a current mirror 566. Load current stage 560 includes a current source 565 coupled between supply potential $V_{DD}$ 470 and current mirror 566. Current mirror 566 includes a diode-connected transistor 567, current sources 562a and 562b, and optionally current sources 564a and 564b. The gates of each current source 562a, 562b, 564a, and 564b are coupled to the gate and drain of diode-connected transistor 567. Because noise performance is not as critical in the low gain transconductance cell as in the high gain transconductance cell, the current mirror and current sources are not degenerated. In other words, the sources of transistors 562a, 562b, 564a, 564b, and 566 do not have resistors. As would be appreciated by persons skilled in the art, other implementations of current mirrors can be implemented in transconductance cell 500.

As in the high gain transconductance cell 300 described above in reference to FIG. 3, current sources 562a, 562b, 564a, and 564b each operate to sink a constant current out of the drain of the transistor to which they are connected. The amount of current sunk is a function of the dimensions of the transistors used in current mirror 566. In addition, the current sunk by each current source is proportional to the current sourced into current mirror 566.

Figure 6:
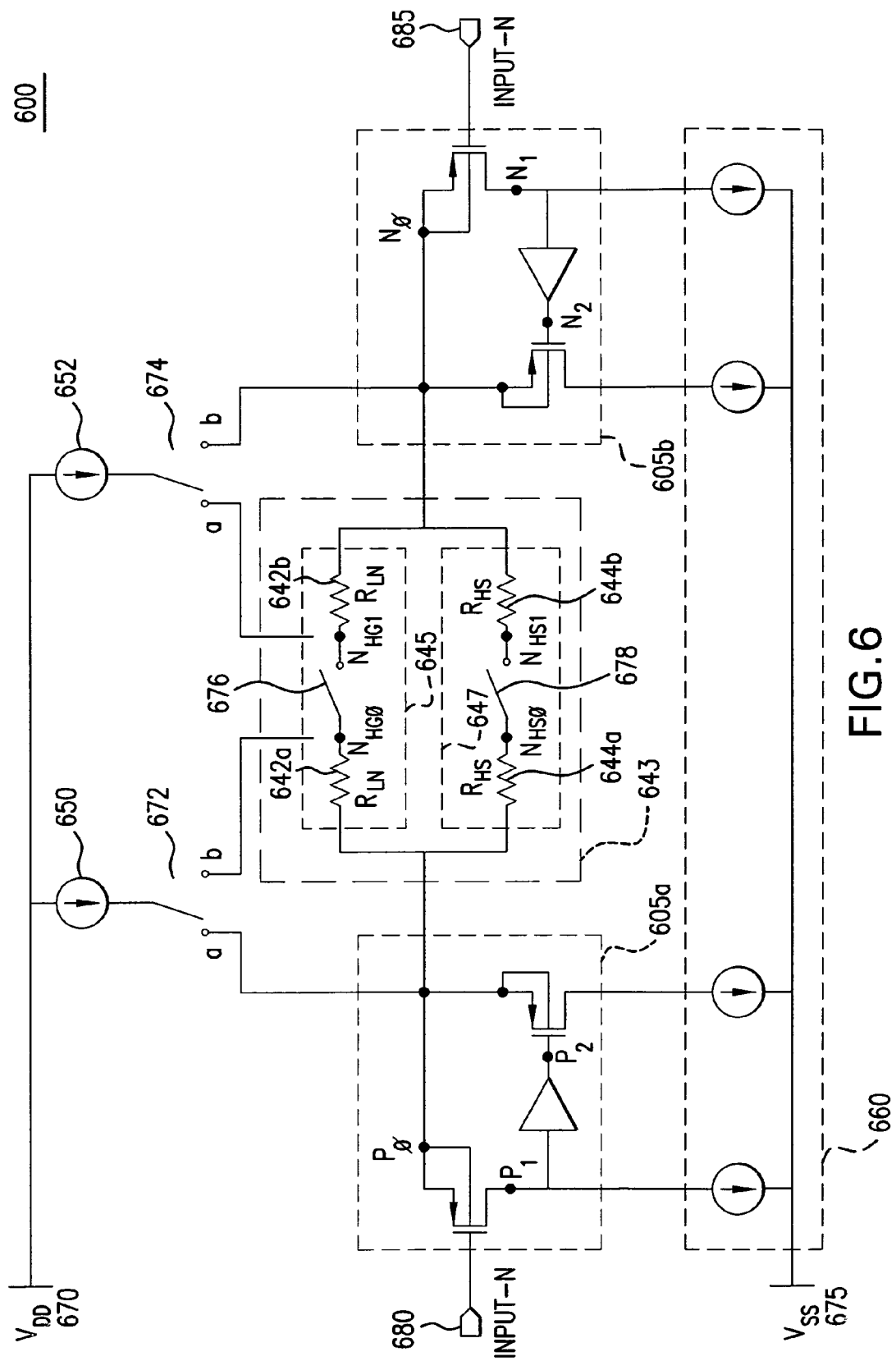
FIG. 6 is a block diagram of a programmable transconductance cell 600 that can operate as a low noise, high gain transconductance cell or a high swing, low gain transconductance cell, according to embodiments of the present invention.

FIG. 6 is a block diagram of a programmable transconductance cell 600 that can operate as a low noise transconductance cell implemented with high gain or a high swing transconductance cell implemented with low gain, according to embodiments of the present invention. Programmable transconductance cell 600 includes feedback loops 605a, 605b, load current stage 660, bias currents 650 and 652, and programmable resistance stage 643. Feedback loops 605a, 605b and load current stage 660 are the same as those described above in reference to FIG. 1 and FIG. 4.

Resistance stage 643 includes a first resistance stage 645 and a second resistance stage 647. First resistance stage 645 includes a first resistor 642a coupled between node $P_0$ and node $N_{hg0}$, a second resistor 642b coupled between node $N_0$ and node $N_{hg1}$, and a switch 676 coupled between resistors 642a and 642b. Second resistance stage 647 includes a first resistor 644a coupled between node $P_0$ and node $N_{hs0}$, a second resistor 644b coupled between node $N_0$ and node $N_{hs1}$, and a switch 678 coupled between resistors 644a and 644b. In an embodiment of the present invention, resistance stage 643 includes a plurality of resistance stages. In an embodiment of the present invention, programmable transconductance cell 600 includes a resistor coupled between feedback loops 605a and 605b, in parallel with resistance stage 643.

Programmable transconductance cell 600 further includes bias current switches 672 and 674. Bias current switch 672 has a first terminal coupled to bias current source 650, a second terminal coupled to node $P_0$, and a third terminal coupled to node $N_{hg0}$. Bias current switch 674 has a first terminal coupled to bias current source 652, a second terminal coupled to node $N_0$, and a third terminal coupled to node $N_{hg1}$.

When low noise, high gain mode is selected, switch 676 is closed coupling resistors 642a and 642b in series between the sources of input transistors 110a and 110b. Switch 678 remains open. In this mode, switch 672 couples bias current source 650 to node $N_{hg0}$ and switch 674 couples bias current source 652 to node $N_{hg1}$. Thus, in low noise mode, both bias current sources are switched between series connected resistors 642a and 642b.

When high swing, low gain node is selected, switch 678 is closed coupling resistors 644a and 644b in series between the sources of input transistors 10a and 10b. Switch 676 remains open. In this mode, switch 672 couples bias current source 650 to node $P_0$ and switch 674 couples bias current source 652 to node $N_0$. Thus, in high swing mode, the bias current sources are switched to the outside of the series connected resistors to obtain more headroom at the expense of some increase in differential noise.

For example, high gain resistor 642a has a value of 3 Kohm and resistor 642b has a value of 3 Kohm. The transconductance obtained with the circuit in high gain mode is $G_m = \frac{1}{6}$ Kohm = 167 µA/V. This is high gain mode because the transconductance is the largest. In the same example, low gain resistor 644a has a value of 9 Kohm and resistor 644b has a value of 9 Kohm. The transconductance obtained with the circuit in high swing, low gain mode is $G_m = \frac{1}{18}$ Kohm = 55.6 µA/V.

Figure 7:
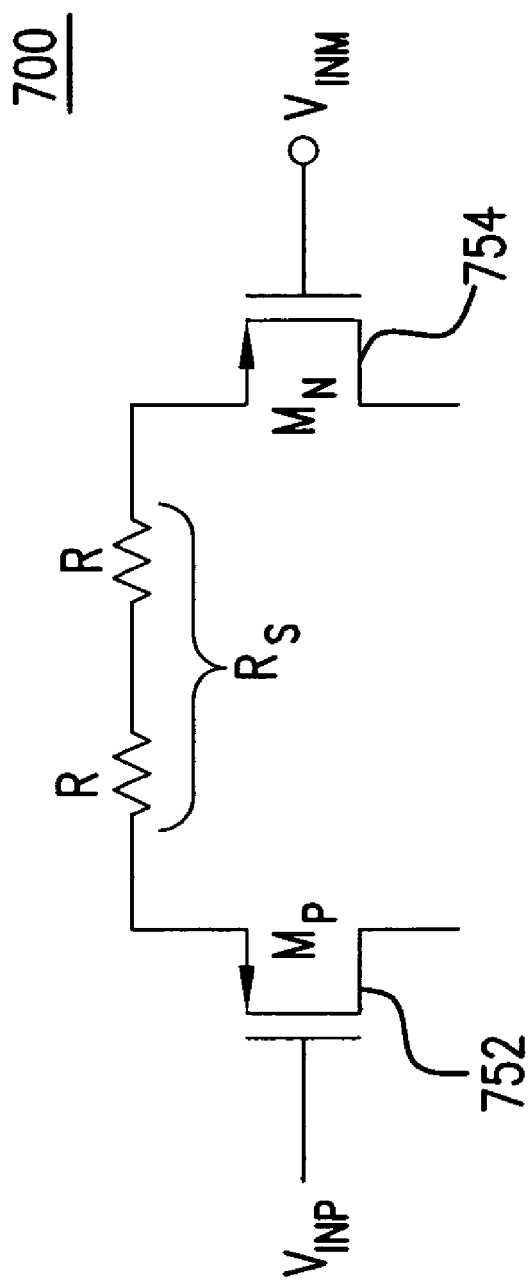
FIG. 7 is a block diagram of a conventional degenerated differential transistor pair circuit.

Operation and advantages of the present invention may be illustrated through comparison with a conventional resistively degenerated differential transistor pair circuit (RDTP) 700 illustrated in FIG. 7. Conventional RDTP circuit 700 includes a first input transistor 752 and a second input transistor 754. A series resistance $R_s$ 756 is coupled to the source of input transistor 752 and the source of input transistor 754. The drain of input transistor 752 and the drain of input transistor 754 are coupled to receive a differential input voltage, $V_{inp}$, $V_{inm}$. The linearity and gain accuracy of RDTP circuit 700 depends upon the product of the transistor transconductance, $g_m$, and series resistance, $R_s$. Thus, the linearity and gain accuracy of RDTP circuit 700 can be improved by increasing the product of $g_m$ and $R_s$.

A larger $g_m*R_s$ value (e.g., 3 to 10 times or larger) is desirable to reduce nonlinearity and improve gain accuracy. For large $g_m*R_s$ values, RDTP circuit gain is substantially determined by the inverse of the series resistance, $1/R_s$. In addition, the gain is substantially unaffected by the transistor transconductance, $g_m$. Consequently, for an implementation of RDTP circuit 700 with a particular gain value, the only significant means to improve linearity and gain accuracy is through increased transistor transconductance. However, an increase in power consumption is typically required to obtain larger transistor transconductance, and thereby, improved RDTP linearity and gain accuracy.

In comparison, more parameters affect circuit operation in the present invention. The circuit operation will be described in reference to FIG. 1. However, persons skilled in the relevant art(s) will recognize that the description also applies to other embodiments of the present invention described herein. The linearity and gain accuracy of the present invention depends upon the product: $A_i*gm_i*r_o*gm_o*R_s$ where $A_i$ = gain of the inverting gain stage 120a, 120b $gm_i$ = transistor transconductance of input transistor 110a, 110b, $r_o$ = output resistance at nodes P1, N1

$gm_o$ = transistor transconductance of output transistor 130a, 130b, and $R_s$ = series resistance of resistors 140a, 140b.

A larger $A_i*gm_i*r_o*gmo*R_s$ value (e.g., 100 to 1000 or larger) is desirable to obtain very linear operation with the present invention. For large values of $A_i*gm_i*r_o*gm_o*R_s$, the gain is almost exclusively determined by the inverse of the series resistance, $1/R_s$. Because the gain to a high degree depends only upon $R_s$, gain accuracy of the present invention is very good. For an implementation of the present invention with a specific gain value, the linearity and gain accuracy may be improved by increasing $A_i$, $gm_i$, $r_o$, and/or $gm_o$. Because there are more degrees of freedom to obtain good linearity and good gain accuracy, the product of the values of these parameters with $R_s$ can more easily be increased in the present invention than the product of $g_m$ and $R_s$ in RDTP circuit 700. Thus, the present invention may be implemented with improved linearity and gain accuracy in addition to equal or lower power consumption.

The effect of transistor and resistor noise upon the output current signal in the present invention is similar to the effect of these noise sources in conventional RDTP circuit 700. In the present invention, input transistors 110a, 110b contribute noise in an equivalent manner to input transistors 752, 754 in the differential transistor pair of RDTP circuit 700. Also, resistors 140a, 140b contribute noise in a manner equivalent to resistors comprising the series resistance 756 of RDTP circuit 700. However, in the present invention, inverting gain stages 120a, 120b, and output transistors 130a, 130b also contribute noise.

An advantage of the present invention is that the noise contributed by inverting gain stages 120a, 120b and output transistors 130a, 130b is divided by the product of $gm_i$ and $r_o$. Consequently, by making $gm_i * r_o$ large, the noise of the added circuitry in the present invention can be made to have an insignificant effect on the circuit performance. In comparison with RDTP circuit 500, linearity and gain accuracy improvements of the present invention can be obtained without any significant penalty of increased noise.

Figure 8:
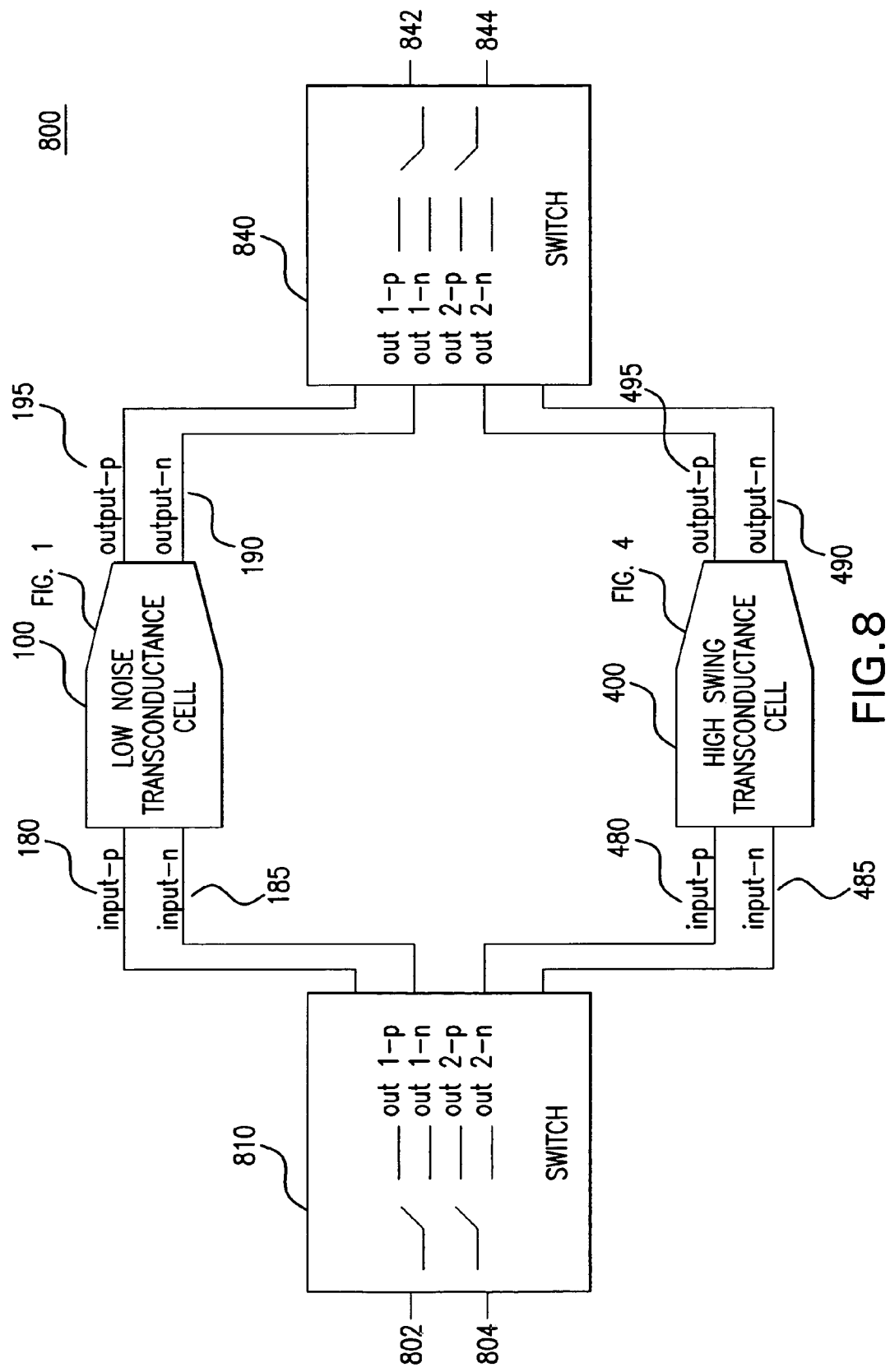
FIG. 8 is a block diagram of a portion of a circuit having a high gain transconductance cell and a low gain transconductance cell according to embodiments of the present invention.

FIG. 8 is a block diagram of a portion of an analog circuit 800 having a low noise transconductance cell implemented using small valued resistors to provide high gain transconductance and a high swing transconductance cell implemented with high valued resistors to provide low gain transconductance, according to embodiments of the present invention. Circuit portion 800 can be used in any circuit that requires a programmable circuit such as a programmable gain amplifier (PGA) or an analog filter. Analog circuit 800 includes a low noise transconductance cell 100 implemented with high gain, a high swing transconductance cell 400 implemented with low gain, and an output switch 840. In an embodiment of the present invention, circuit 800 may also include an input switch.

In an embodiment, input switch 810 receives a differential input at input-p 802 and input-n 804. If a low gain, high swing transconductance cell is required, input switch 810 then couples input-p 802 and input-n 804 to input-p 480 and input-n 485 of low gain, high swing transconductance cell 400. Output switch 840 then couples output-p 495 and output-n 490 to output-p 842 and output-n 844. If a high gain, low noise transconductance cell is required, input switch 810 couples input-p 802 and input-n 804 to input-p 180 and input-n 185 of high gain, low noise transconductance cell 100. Output switch 840 then couples output-p 195 and output-n 190 to output-p 842 and output-n 844.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A transconductance cell comprising:
   a first resistor having a first terminal and a second terminal;
   a first half-circuit including:
      a first feedback loop wherein the first feedback loop includes a first input transistor receiving a first input voltage at its gate and having a source coupled to the first terminal of the first resistor, a first output transistor having a source coupled to the first terminal of the first resistor, and an inverter stage having an input coupled to a drain of the first input transistor and an output coupled to a gate of the first output transistor, wherein the first output transistor provides a first output current at its drain
   wherein the operation of the first feedback loop causes $V_{GS}$ of the first input transistor to remain substantially constant; and
   a second half-circuit including:
      a second feedback loop wherein the second feedback loop includes a second input transistor receiving a second input voltage at its gate and having a source coupled to the second terminal of the first resistor, a second output transistor having a source coupled to the second terminal of the first resistor, and an inverter stage having an input coupled to a drain of the second input transistor and an output coupled to a gate of the second output transistor, wherein the second output transistor provides a second output current at its drain
   wherein the operation of the second feedback loop causes $V_{GS}$ of the second input transistor to remain substantially constant.

2. The transconductance cell of claim 1, wherein the first input voltage is a positive input voltage and the first output current is a negative output current and the second input voltage is a negative input voltage and the second output current is a positive output current.

3. The transconductance cell of claim 1, further comprising:
   a first current source coupled to the drain of the first input transistor; and
   a second current source coupled to the drain of the second input transistor.

4. The transconductance cell of claim 1, further comprising:
   a first impedance coupled to the drain of the first input transistor; and
   a second impedance coupled to the drain of the second input transistor.

5. A transconductance cell comprising:
   a first resistor having a first terminal and a second terminal;
   a first half-circuit including:
      a first feedback loop wherein the first feedback loop includes a first input transistor receiving a first input voltage at its gate and having a source coupled to the first terminal of the first resistor, a first output transistor having a source coupled to the first terminal of the first resistor, and an inverter stage having an input coupled to a drain of the first input transistor and an output coupled to a gate of the first output transistor, wherein the first output transistor provides a first output current at its drain; and
   a second half-circuit including:
      a second feedback loop wherein the second feedback loop includes a second input transistor receiving a second input voltage at its gate and having a source coupled to the second terminal of the first resistor, a second output transistor having a source coupled to the second terminal of the first resistor, and an inverter stage having an input coupled to a drain of the second input transistor and an output coupled to a gate of the second output transistor, wherein the second output transistor provides a second output current at its drain,
   a first impedance coupled to the drain of the first input transistor; and a second impedance coupled to the drain of the second input transistor,
wherein the first impedance comprises a resistor and the second impedance comprises a resistor.

6. The transconductance cell of claim 1, further comprising:
a first bias current source coupled to the first terminal of the first resistor; and
a second bias current source coupled to the second terminal of the first resistor.

7. The transconductance cell of claim 1, wherein a well of the first input transistor and a well of the second input transistor are coupled to their respective sources.

8. The transconductance cell of claim 1, wherein the first input transistor and the second input transistor are of the same polarity.

9. The transconductance cell of claim 1, wherein the first output transistor and the second output transistor are of the same polarity.

10. The transconductance cell of claim 1, wherein the first input transistor and the second input transistor are PMOS transistors.

11. The transconductance cell of claim 1, wherein the first output transistor and the second output transistor are PMOS transistors.

12. The transconductance cell of claim 3, wherein the first half-circuit further comprises a third current source coupled to the drain of the first output transistor and the second half-circuit further comprises a fourth current source coupled to the drain of the second output transistor.

13. The transconductance cell of claim 3, wherein the first current source comprises a first current source transistor and the second current source comprises a second current source transistor, and
wherein the drain of the first current source transistor is coupled to the drain of the first input transistor and the drain of the second current source transistor is coupled to the drain of the second input transistor.

14. The transconductance cell of claim 13, wherein the first and second current source transistors have a common polarity.

15. The transconductance cell of claim 14, wherein the first and second current source transistors are NMOS transistors.

16. A transconductance cell comprising:
a first half-circuit including:
a first resistor, and
a first feedback loop wherein the first feedback loop includes a first input transistor receiving a first input voltage at its gate, a first output transistor having a source coupled to a source of the first input transistor and a first terminal of the first resistor, and an inverter stage having an input coupled to a drain of the first input transistor and an output coupled to a gate of the first output transistor, wherein the first output transistor provides a first output current at its drain
wherein the operation of the first feedback loop causes $V_{GS}$ of the first input transistor to remain substantially constant; and
a second half-circuit including:
a second resistor having a first terminal coupled to a second terminal of the first resistor, and
a second feedback loop wherein the second feedback loop includes a second input transistor receiving a second input voltage at its gate, a second output transistor having a source coupled to a source of the second input transistor and a second terminal of the second resistor, and an inverter stage having an input coupled to a drain of the second input transistor and an output coupled to a gate of the second output transistor, wherein the second output transistor provides a second output current at its drain,
wherein the operation of the second feedback loop causes $V_{GS}$ of the second input transistor to remain substantially constant.

17. The transconductance cell of claim 16, wherein the first input voltage is a positive input voltage and the first output current is a negative output current and the second input voltage is a negative input voltage and the second output current is a positive output current.

18. The transconductance cell of claim 16, further comprising:
a first current source coupled to the drain of the first input transistor; and
a second current source coupled to the drain of the second input transistor.

19. The transconductance cell of claim 16, further comprising:
a first impedance coupled to the drain of the first input transistor; and
a second impedance coupled to the drain of the second input transistor.

20. The transconductance cell of claim 19, wherein the first impedance comprises a resistor and the second impedance comprises a resistor.

21. The transconductance cell of claim 16, further comprising a bias current source coupled to the second terminal of the first resistor and the first terminal of the second resistor.

22. The transconductance cell of claim 16, further comprising:
a first bias current source coupled to the first terminal of the first resistor; and
a second bias current source coupled to the second terminal of the second resistor.

23. The transconductance cell of claim 16, further comprising:
a first bias current source coupled to the second terminal of the first resistor and the first terminal of the second resistor;
a second bias current source coupled to the first terminal of the first resistor; and
a third bias current source coupled to the second terminal of the second resistor.

24. The transconductance cell of claim 16, wherein a well of the first input transistor and a well of the second input transistor are coupled to their respective sources.

25. The transconductance cell of claim 18 wherein the first half-circuit further comprises a third current source coupled to the drain of the first output transistor and the second half-circuit further comprises a fourth current source coupled to the drain of the second output transistor.

26. The transconductance cell of claim 18, wherein the first current source comprises a first current source transistor coupled in series with a third resistor and the second current source comprises a second current source transistor coupled in series with a fourth resistor,
wherein the drain of the first current source transistor is coupled to the drain of the first input transistor and the drain of the second current source transistor is coupled to the drain of the second input transistor.

27. The transconductance cell of claim 26, further comprising a capacitor coupled to a gate of the first and second current source transistors.

28. The transconductance cell of claim 18, wherein the first current source comprises a first current source transistor and the second current source comprises a second current source transistor, and
wherein the drain of the first current source transistor is coupled to the drain of the first input transistor and the drain of the second current source transistor is coupled to the drain of the second input transistor.

29. An analog circuit comprising:
a low noise transconductance cell having a first output node and a second output node, wherein the low noise transconductance cell comprises:
a first half-circuit including:
a first resistor, and
a feedback loop wherein the feedback loop includes a first input transistor receiving a first input voltage at its gate, a first output transistor having a source coupled to a source of the first input transistor and a first terminal of the first resistor, and an inverter stage having an input coupled to a drain of the first input transistor and an output coupled to a gate of the first output transistor, wherein the first output transistor provides a first output current at its drain;
a second half-circuit including:
a second resistor having a first terminal coupled to a second terminal of the first resistor, and
a feedback loop wherein the feedback loop includes a second input transistor receiving a second input voltage at its gate, a second output transistor having a source coupled to a source of the second input transistor and a second terminal of the second resistor, and an inverter stage having an input coupled to a drain of the second input transistor and an output coupled to a gate of the second output transistor, wherein the second output transistor provides a second output current at its drain; and
a bias current source coupled to the second terminal of the first resistor and the first terminal of the second resistor;
a high swing transconductance cell having a first output node and a second output node; and
an output switch having a first input node coupled to the first output node of the low noise transconductance cell, a second input node coupled to the second output node of the low noise transconductance cell, a third input node coupled to the first output node of the high swing transconductance cell, and a fourth input node coupled to the second output node of the high swing transconductance cell,
wherein a first and a second output node of the output switch are coupled to the first and second input nodes of the output switch when the low noise transconductance cell is selected and the first and second output nodes of the output switch are coupled to the third and fourth input nodes of the output switch when the high swing transconductance cell is selected.

30. The analog circuit of claim 29, wherein the high swing transconductance cell comprises:
a first resistor having a first terminal and a second terminal;
a first half-circuit including:
a feedback loop wherein the feedback loop includes a first input transistor receiving a first input voltage at its gate and having a source coupled to the first terminal of the first resistor, a first output transistor having a source coupled to the first terminal of the first resistor, and an inverter stage having an input coupled to a drain of the first input transistor and an output coupled to a gate of the first output transistor, wherein the first output transistor provides a first output current at its drain;
a second half-circuit including:
a feedback loop wherein the feedback loop includes a second input transistor receiving a second input voltage at its gate and having a source coupled to the second terminal of the first resistor, a second output transistor having a source coupled to the second terminal of the first resistor, and an inverter stage having an input coupled to a drain of the second input transistor and an output coupled to a gate of the second output transistor, wherein the second output transistor provides a second output current at its drain;
a first bias current source coupled to the first terminal of the first resistor; and
a second bias current source coupled to the second terminal of the first resistor.

31. The analog circuit of claim 29 wherein the high swing transconductance cell comprises:
a first half-circuit including:
a first resistor, and
a feedback loop wherein the feedback loop includes a first input transistor receiving a first input voltage at its gate, a first output transistor having a source coupled to a source of the first input transistor and a first terminal of the first resistor, and an inverter stage having an input coupled to a drain of the first input transistor and an output coupled to a gate of the first output transistor, wherein the first output transistor provides a first output current at its drain;
a second half-circuit including:
a second resistor having a first terminal coupled to a second terminal of the first resistor, and
a feedback loop wherein the feedback loop includes a second input transistor receiving a second input voltage at its gate, a second output transistor having a source coupled to a source of the second input transistor and a second terminal of the second resistor, and an inverter stage having an input coupled to a drain of the second input transistor and an output coupled to a gate of the second output transistor, wherein the second output transistor provides a second output current at its drain;
a first bias current source coupled to the first terminal of the first resistor; and
a second bias current source coupled to the second terminal of the second resistor.

32. A transconductance cell comprising:
a first half-circuit including:
a first resistor, and
a first feedback loop coupled to a first terminal of the first resistor, wherein the first feedback loop includes a first inverter stage, a first input transistor having a drain coupled to an input of the first inverter stage and a first output transistor having a gate coupled to an output of the first inverter stage, wherein the first feedback loop is configured to keep $V_{GS}$ of the first input transistor constant;

a second half-circuit including:
- a second resistor having a first terminal coupled to a second terminal of the first resistor, and
- a second feedback loop coupled to a second terminal of the second resistor, wherein the second feedback loop includes a second inverter stage, a second input transistor having a drain coupled to an input of the first inverter stage and a first output transistor having a gate coupled to an output of the first inverter stage, wherein the second feedback loop is configured to keep $V_{GS}$ of the second input transistor constant.

33. The transconductance cell of claim 32, further comprising
- a first current source coupled to the first input transistor; and
- a second current source coupled to the second input transistor.

34. A transconductance cell comprising:
- a first resistor having a first terminal and a second terminal;
- a first half-circuit including:
  - a feedback loop coupled to the first terminal of the first resistor, wherein the feedback loop includes a first inverter stage, a first input transistor having a drain coupled to an input of the first inverter stage, and a first output transistor having a gate coupled to an output of the first inverter stage, wherein the feedback loop is configured to keep $V_{GS}$ of the first input transistor constant; and
- a second half-circuit including:
  - a feedback loop coupled to the second terminal of the first resistor, wherein the feedback loop includes a second inverter stage, a second input transistor having a drain coupled to an input of the first inverter stage, and a first output transistor having a gate coupled to an output of the first inverter stage, wherein the feedback loop is configured to keep $V_{GS}$ of the second input transistor constant.

35. The transconductance cell of claim 34, further comprising
- a first current source coupled to the first input transistor; and
- a second current source coupled to the second input transistor.

36. A transconductance cell comprising:
- a first feedback loop wherein the feedback loop includes:
  - a first input transistor receiving a first input voltage at its gate,
  - a first amplifier having a positive terminal and a negative terminal, wherein the negative terminal is coupled to a drain of the first input transistor,
  - a first floating voltage source having a first end coupled to a source of the first input transistor and a second end coupled to the positive terminal of the amplifier, and
  - a first output transistor having a gate coupled to an output of the amplifier, wherein the first output transistor provides a first output current at its drain; and
- a second feedback loop wherein the feedback loop includes:
  - a second input transistor receiving a second input voltage at its gate,
  - a second amplifier having a positive terminal and a negative terminal, wherein the negative terminal is coupled to a drain of the second input transistor,
  - a second floating voltage source having a first end coupled to a source of the second input transistor and a second end coupled to the positive terminal of the amplifier, and
  - a second output transistor having a gate coupled to an output of the amplifier, wherein the second output transistor provides a second output current at its drain.

37. The transconductance cell of claim 36, wherein the first input voltage is a positive input voltage and the first output current is a negative output current and the second input voltage is a negative input voltage and the second output current is a positive output current.

38. A transconductance cell comprising:
- a first half-circuit including:
  - a first feedback loop wherein the first feedback loop includes a first input transistor receiving a first input voltage at its gate and having a source, a first output transistor having a source coupled to the source of the first input transistor, and an inverter stage having an input coupled to a drain of the first input transistor and an output coupled to a gate of the first output transistor, wherein the first output transistor provides a first output current at its drain
  - wherein the operation of the first feedback loop causes $V_{GS}$ of the first input transistor to remain substantially constant;
- a second half-circuit including:
  - a second feedback loop wherein the second feedback loop includes a second input transistor receiving a second input voltage at its gate and having a source, a second output transistor having a source coupled to the source of the second input transistor, and an inverter stage having an input coupled to a drain of the second input transistor and an output coupled to a gate of the second output transistor, wherein the second output transistor provides a second output current at its drain
  - wherein the operation of the second feedback loop causes $V_{GS}$ of the second input transistor to remain substantially constant; and
- a plurality of switchable resistance stages.

39. The transconductance cell of claim 38, wherein one of the plurality of switchable resistance stages is coupled between the first feedback loop and the second feedback loop when the first, second, third, and fourth switches are closed.

40. The transconductance cell of claim 38 further comprising a resistor coupled to the source of the first input transistor and to the source of the second input transistor.

41. The transconductance cell of claim 38, further comprising:
- a current source coupled to a first terminal of a fifth switch, wherein a second terminal of the fifth switch is coupled to one of the plurality of resistance stages.

42. The transconductance cell of claim 41, wherein the current source is coupled to one of the plurality of resistance stages when the fifth switch is closed.

43. A transconductance cell comprising:
- a first resistance stage, wherein the first resistance stage includes:
  - a first resistor having a first and a second terminal,
  - a second resistor having a first and a second terminal, and
  - a first switch wherein a first terminal of the first switch is coupled to the second terminal of the first resistor and a second terminal of the first switch is coupled to the second terminal of the second resistor;
a second resistance stage, wherein the second resistance stage includes:
a third resistor having a first and a second terminal,
a fourth resistor having a first and a second terminal, and
a second switch wherein a first terminal of the second switch is coupled to the second terminal of the third resistor and a second terminal of the second switch is coupled to the second terminal of the fourth resistor; and
a first feedback loop coupled to the first terminal of the third resistor and the first terminal of the first resistor;
a second feedback loop coupled to the first terminal of the fourth resistor and the first terminal of the second resistor;
a first current source coupled to a first terminal of a third switch; and
a second current source coupled to a first terminal of a fourth switch,
wherein a second terminal of the third switch is coupled to the first feedback loop and a third terminal of the third switch is coupled to the second terminal of the first resistor in the first resistance stage, and
wherein a second terminal of the fourth switch is coupled to the second feedback loop and a third terminal of the fourth switch is coupled to the second terminal of the second resistor in the second resistance stage.

44. The transconductance cell of claim 43, wherein the first resistance stage is coupled between the first feedback loop and the second feedback loop when the first switch is closed.

45. The transconductance cell of claim 43, wherein the second resistance stage is coupled between the first feedback loop and the second feedback loop when the second switch is closed.

46. The transconductance cell of claim 43 further comprising a resistor coupled to the first feedback loop and to the second feedback loop.

47. The transconductance cell of claim 38, wherein each of the plurality of resistance stages includes:
a first resistor having a first and a second terminal,
a second resistor having a first and a second terminal, and
a first switch wherein a first terminal of the first switch is coupled to the second terminal of the first resistor and a second terminal of the first switch is coupled to the second terminal of the second resistor.

48. A transconductance cell comprising:
a resistor having a first and a second terminal; and
a feedback loop wherein the feedback loop includes an input transistor receiving an input voltage at its gate and having a source coupled to the first terminal of the first resistor, an output transistor having a source coupled to the first terminal of the first resistor, and an inverter stage having an input coupled to a drain of the input transistor and an output coupled to a gate of the output transistor, wherein the first output transistor provides an output current at its drain
wherein the operation of the feedback loop cause $V_{GS}$ of the input transistor to remain substantially constant.

49. The transconductance cell of claim 38, wherein each of the plurality of switchable resistance stages includes a resistance wherein a first end of the resistance is coupled to a first terminal of a first switch and to a first terminal of a second switch and a second end of the resistance is coupled to a first terminal of a third switch and to a first terminal of a fourth switch, and wherein the second terminal of the first switch is coupled to the source of the first input transistor, the second terminal of the second switch is coupled to the source of first output terminal, the second terminal of the third switch is coupled to the source of the second input transistor, and the second terminal of the fourth switch is coupled to the source of the second output transistor.

50. The transconductance cell of claim 4, wherein the first impedance comprises a resistor and the second impedance comprises a resistor.

* * * * *